US012805026B2

(12) United States Patent
Xu et al.

(10) Patent No.: US 12,805,026 B2
(45) Date of Patent: Nov. 17, 2026

(54) PREPARATION METHOD OF GALLIUM OXIDE DEVICE BASED ON HIGH-TEMPERATURE ANNEALING TECHNOLOGY AND GALLIUM OXIDE DEVICE

(71) Applicant: UNIVERSITY OF SCIENCE AND TECHNOLOGY OF CHINA

(72) Inventors: Guangwei Xu, Hefei (CN); Qiming He, Hefei (CN); Xuanze Zhou, Hefei (CN); Qiuyan Li, Hefei (CN); Xiaolong Zhao, Hefei (CN); Shibing Long, Hefei (CN)

(73) Assignee: UNIVERSITY OF SCIENCE AND TECHNOLOGY OF CHINA, Anhui (CN)

( * ) Notice: Subject to any disclaimer, the term of this patent is extended or adjusted under 35 U.S.C. 154(b) by 582 days.

(21) Appl. No.: 18/344,625

(22) Filed: Jun. 29, 2023

(65) Prior Publication Data

US 2024/0079478 A1 Mar. 7, 2024

Related U.S. Application Data

(63) Continuation of application No. PCT/CN2022/119588, filed on Sep. 19, 2022.

(30) Foreign Application Priority Data

Sep. 7, 2022 (CN) ......................... 202211089756.9

(51) Int. Cl.
*H10D 99/00* (2025.01)
*H10D 8/60* (2025.01)
*H10P 95/90* (2026.01)

(52) U.S. Cl.
CPC ............... *H10D 99/00* (2025.01); *H10D 8/60* (2025.01); *H10P 95/90* (2026.01)

(58) Field of Classification Search
CPC ......... H10D 8/60; H10D 99/00; H01L 21/477
See application file for complete search history.

(56) References Cited

U.S. PATENT DOCUMENTS 3,964,084 A * 6/1976 Andrews, Jr. ............ H10D 8/60 257/E29.338
4,062,033 A * 12/1977 Suzuki .................. H10D 99/00 257/E29.338

(Continued)

FOREIGN PATENT DOCUMENTS

CN 111785776 A 10/2020
CN 113161410 A 7/2021

(Continued)

OTHER PUBLICATIONS

Machine translation of CN 111785776 (Year: 2025).*
Machine translation of CN 113161410 (Year: 2025).*

*Primary Examiner* — Vincent Wall
(74) *Attorney, Agent, or Firm* — MUNCY, GEISSLER, OLDS & LOWE, P.C.

(57) ABSTRACT

A preparation method of a gallium oxide device based on high-temperature annealing technology and a gallium oxide device are provided. The preparation method includes: preparing a first barrier layer on a surface of a gallium oxide wafer to block an oxygen atmosphere; implementing a patterning process for regulating impurities of the gallium oxide wafer on the barrier layer, a process depth of the patterning process not exceeding a thickness of the barrier layer; annealing the gallium oxide wafer subjected to above treatment in the oxygen atmosphere; removing the barrier layer; and removing a surface layer of the gallium oxide wafer with the barrier layer lifted off. Problems that a local (Continued)

region of a gallium oxide material cannot be treated alone and net carrier concentration in a selective region of the gallium oxide material cannot be regulated with high-temperature annealing technology in the oxygen atmosphere in related art are solved.

9 Claims, 3 Drawing Sheets

(56) References Cited

U.S. PATENT DOCUMENTS

2005/0258483 A1* 11/2005 Templier .................. H10D 8/60 257/341
2014/0061647 A1* 3/2014 Werner ................ H10D 12/441 257/51
2015/0179445 A1* 6/2015 Sasaki ................... C30B 23/025 257/43
2019/0393350 A1* 12/2019 Thompson ........... H10D 30/751
2020/0168460 A1* 5/2020 Kuramata .............. H10D 62/80
2020/0357629 A1* 11/2020 Colombeau ....... H01L 21/76841
2021/0098628 A1* 4/2021 Lv ......................... H01L 21/477
2022/0051892 A1* 2/2022 Jeon .................. H01L 21/02414
2023/0352600 A1* 11/2023 Tadjer ............... H01L 21/02576
2023/0361195 A1* 11/2023 Tsui ..................... H10D 30/665
2023/0420539 A1* 12/2023 Spencer ................. H10D 99/00
2024/0079478 A1* 3/2024 Xu ........................ H01L 21/477

FOREIGN PATENT DOCUMENTS

CN 114743874 A * 7/2022 ........... H10D 62/103
CN 115410923 A * 11/2022 ............. H10D 62/80

* cited by examiner

PREPARATION METHOD OF GALLIUM OXIDE DEVICE BASED ON HIGH-TEMPERATURE ANNEALING TECHNOLOGY AND GALLIUM OXIDE DEVICE

CROSS REFERENCE TO RELATED APPLICATIONS

This application is a Continuation of U.S. National Stage of International Application No. PCT/CN2022/119588, filed on Sep. 19, 2022, for which priority is claimed under 35 U.S.C. § 120, which claims priority to 202211089756.9, filed in China on Sep. 7, 2022, the entire contents of all of which are hereby incorporated by reference.

TECHNICAL FIELD

The disclosure relates to semiconductor material processing technology, in particular to a preparation method of a gallium oxide device based on high-temperature annealing technology and a gallium oxide device.

BACKGROUND ART

At present, regulation of net carrier concentration in a selective region of a gallium oxide material is mainly realized by ion implantation. For example, donor impurities such as Si, Sn and Ge are doped to improve the net carrier concentration, and acceptor impurities such as Fe, Mg and N are doped to compensate for free electrons, thus reducing the net carrier concentration. However, there are many challenges in ion implantation technology of the gallium oxide material, both economically and technically. Firstly, economically, cost of the ion implantation technology is very high. In addition to using high-power devices to emit high-energy ions, further high-temperature annealing is required to activate implanted ions and repair damage caused by high-energy ions to materials, both of which have great energy consumption. As far as technical characteristics of ion implantation of the gallium oxide materials are concerned, activation efficiency of implanted ions is not clear at present; it is difficult to implant at a deeper position in the material; implanted ions may diffuse, it is difficult to control a precise dose, and there is no accurate definition about a distribution law of implanted ions at present; after implantation, types and distribution of caused defects in materials are not clear; and technical barriers such as immature repair technology of defects have greatly hindered application of ion implantation technology.

Besides the ion implantation, another way to change conductivity of the gallium oxide materials is high-temperature oxygen annealing. However, the high-temperature oxygen annealing may affect conductivity of the whole material, and a certain region on the material can't be selectively treated, which limits application range of this technology.

Therefore, for net carrier concentration regulation technology for a selective region of the gallium oxide material, great technical barriers of both the ion implantation technology and the high temperature oxygen annealing technology at present should be broken through so as to better meet future development of semiconductor devices based on the gallium oxide materials.

SUMMARY

The disclosure mainly aims to solve problems that a local region of a gallium oxide material cannot be treated alone and net carrier concentration in a selective region of the gallium oxide material cannot be regulated with high-temperature annealing technology in related art.

In order to solve the above technical problems, the present disclosure provides following technical solutions.

A preparation method of a gallium oxide device based on high-temperature annealing technology includes:

- preparing a barrier layer on a surface of a gallium oxide wafer, the barrier layer functioning in blocking an oxygen atmosphere during a high-temperature oxygen annealing process;
- implementing a patterning process for regulating impurities of the gallium oxide wafer on the barrier layer, a process depth of the patterning process not exceeding a thickness of the barrier layer;
- annealing the gallium oxide wafer subjected to above treatment in the oxygen atmosphere;
- removing the barrier layer of the annealed gallium oxide wafer; and
- removing a surface layer of the gallium oxide wafer with the barrier layer lifted off.

As a preferred embodiment, the preparing the barrier layer on the surface of the gallium oxide wafer includes:

- preparing a first barrier layer and a second barrier layer on the surface of gallium oxide wafer, the first barrier layer being grown on a surface of the second barrier layer, the second barrier layer isolating the surface of gallium oxide wafer from the first barrier layer, and being a liftoff layer.

As a preferred embodiment, the preparing the barrier layer on the surface of the gallium oxide wafer includes:

- preparing a first barrier layer and a second barrier layer on the surface of the gallium oxide wafer, the second barrier layer being located between the surface of gallium oxide wafer and the first barrier layer, and a patterning rate of the second barrier layer being lower than that of the first barrier layer, and materials of the first barrier layer and the second barrier layer being selected according to a temperature of the high-temperature oxygen annealing.

As a preferred embodiment, the barrier layer is patterned by photolithography or etching.

As a preferred embodiment, net carrier concentration is regulated by adjusting respective thicknesses or a total thickness of the first barrier layer and the second barrier layer; or

- net carrier concentration of a patterned region not covered by the first barrier layer is regulated by adjusting the thickness of the second barrier layer.

As a preferred embodiment, the barrier layer is prepared on all surfaces of the gallium oxide wafer.

As a preferred embodiment, the net carrier concentration is regulated by parameters such as one or more of an annealing temperature, oxygen concentration and a chamber pressure of an annealing apparatus.

As a preferred embodiment, the barrier layer is patterned by dry etching, and an etching rate of the second barrier layer is less than that of the second barrier layer.

As a preferred embodiment, a material of the barrier layer is selected according to following requirements of:

- a melting point being higher than the annealing temperature; and
- being capable of be removed by a solution with a slow reaction rate with the surface of gallium oxide material.

Further, based on the above method, a gallium oxide device is provided, which includes a gallium oxide epitaxial layer and/or a gallium oxide substrate subjected to regional regulation implemented using the preparation method of the gallium oxide device based on the high temperature annealing technology.

The disclosure relates to a preparation method of a gallium oxide device, which adopts the preparation method of the gallium oxide device based on the high temperature annealing technology a further includes: after removing the surface layer of the gallium oxide wafer with the barrier layer lifted off, growing an ohmic contact electrode on a back surface of the gallium oxide wafer, namely on a gallium oxide substrate layer;

spin coating photoresist on a front surface of the gallium oxide wafer, that is, on a surface of the gallium oxide epitaxial layer;

exposing and developing the photoresist so as to be patterned for growing electrodes, and designing a patterned region in this step in a region with low net carrier concentration;

growing a Schottky electrode by physical vapor deposition technology; and removing excess metal of the Schottky electrode and clean the photoresist.

Another preparation method of a gallium oxide device is further provided, which adopts the preparation method of the gallium oxide device base on the high-temperature annealing technology, and further includes:

patterning regions on the front surface and the back surface of the wafer where net carrier concentration needs to be changed, specifically a region on the wafer for device preparation.

Another preparation method of a gallium oxide device is further provided, which adopts the preparation method of the gallium oxide device base on the high-temperature annealing technology, and further includes: after removing the barrier layer on a patterned part, implanting required ions into the gallium oxide epitaxial layer by ion implantation technology so as to form an ion implantation region, the implanted ions being acceptor impurities or donor impurities;

annealing the gallium oxide wafer subjected to above treatment in an oxygen atmosphere, in which in a high-temperature annealing environment, an implantation region with implanted impurities activated is formed at the ion implantation region, and a high-resistance region is formed at the gallium oxide substrate and the gallium oxide epitaxial layer form under influence of oxygen annealing;

removing the barrier layer of the annealed gallium oxide wafer; and removing a surface layer of the gallium oxide wafer with the barrier layer lifted off.

ADVANTAGES OF THE DISCLOSURE

1) Firstly, influence of the oxygen annealing on the net carrier concentration of the gallium oxide can almost reach more than 1 mm inside the material. Therefore, difficulty in implantation in middle and deep regions of gallium oxide with the ion implantation technology can be solved by combining the annealing in the oxygen atmosphere with the patterning process.

Secondly, compared with ion implantation, the material subjected to high-temperature oxygen annealing exhibits greatly reduced damage to crystal lattice, which can ensure quality of the material and facilitates subsequent use of the material in device preparation. In addition, because there are no problems such as ion activation, ion diffusion and ion distribution in the high temperature oxygen annealing technology, there are fewer technical barriers compared with the ion implantation technology. Finally, a process flow of the high temperature oxygen annealing technology is simpler, which reduces cost compared with the ion implantation.

2) Technical barrier of the high temperature oxygen annealing technology is that there is no suitable barrier layer, which makes it impossible to control net carrier concentration of the material in a certain region, which greatly limits application scenarios of this special treatment method. The present disclosure solves this problem.

3) For application scenarios that do not require highly accurate regulation of the net carrier concentration, such as high resistance terminations, current blocking layers, device isolation, etc., this method has great cost advantage compared with the ion implantation technology. Firstly, the apparatus used in the method of the disclosure is lower in cost than an ion implanter. Secondly, the ion implantation can only be carried out on a single chip, and its efficiency is limited by a maximum number of wafers that the apparatus can handle, and the wafers must be placed horizontally with very low space utilization. In theory, a number of wafers processed in one time using the annealing technology according to this disclosure is directly related to a size of a chamber, and the wafers can be placed vertically in processing, which greatly improves the space utilization and device processing efficiency.

BRIEF DESCRIPTION OF THE DRAWINGS

In order to explain the embodiments of the present disclosure or the technical scheme in the prior art more clearly, the drawings required in the description of the embodiments or the prior art will be briefly introduced below; obviously, the drawings in the following description are only some embodiments of the present disclosure, and other drawings can be obtained according to these drawings by those of ordinary skill in the art without paying creative labor.

Figure 1:
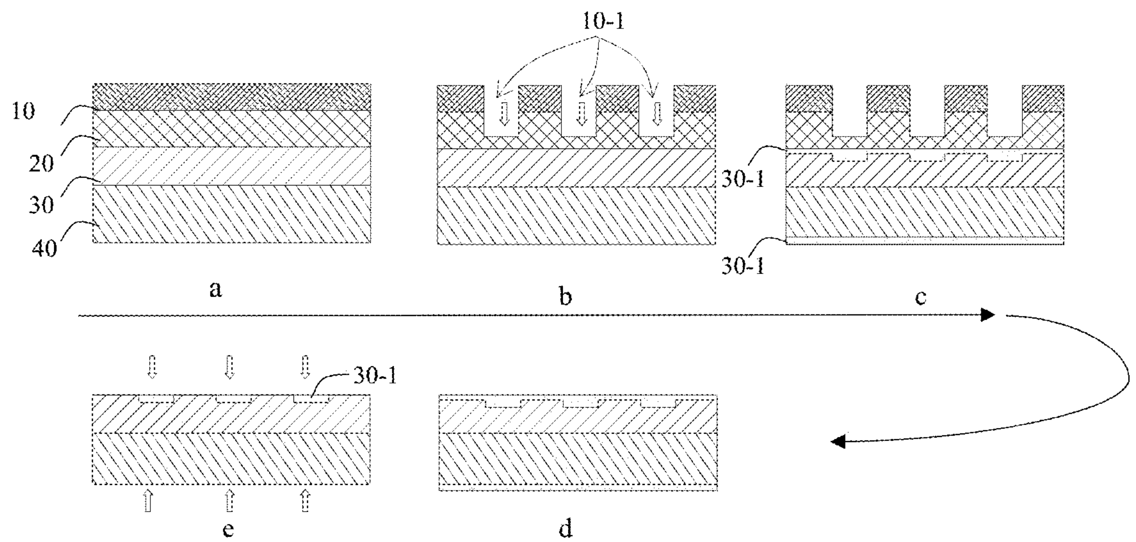
FIG. 1 is a flowchart of a method for regulating net carrier concentration disclosed in Embodiment 2.

10—First Barrier Layer, 20—Second Barrier Layer, 30—Gallium Oxide Epitaxial Layer, 40—Gallium Oxide, 50—Photoresist Layer, 30—1, Annealed Net Carrier Concentration Regulation layer, 60—Ohmic Contact Electrode, 70—Schottky Contact Electrode.

DETAILED DESCRIPTION

Unless otherwise defined, technical terms or scientific terms used in this disclosure indicate common meaning understood by those skilled in the art. Terms “first”, “second”, “third”, “fourth” and similar words used in the specification and claims of this disclosure do not indicate any order, quantity or importance, but are only used to distinguish different components.

Therefore, the features defined as "first", "second", "third" and "fourth" can include one or more of these features explicitly or implicitly. In description of embodiments of this disclosure, unless otherwise specified, "plural" means two or more. Directional terms such as "left", "right", "upper" and "lower" are defined relative to directions schematically placed in the drawings. It should be understood that these directional terms are relative concepts, which are used for relative description and clarification, and can be changed accordingly according to change of directions. In the following, the embodiments of the disclosure may be described with reference to attached drawings. In the following description, reference is made to the accompanying drawings that form a part of this disclosure and show by way of illustration specific aspects of embodiments of this disclosure or specific aspects in which the embodiments of this disclosure can be used. It should be understood that the embodiments of the present disclosure may be used in other aspect and may include structural or logical changes not depicted in the drawings. Therefore, following detailed description should not be taken in a limiting sense, and a scope of this disclosure is defined by the appended claims. In addition, it should also be understood that features of various exemplary embodiments and/or aspects described herein can be combined with each other unless explicitly stated otherwise.

Embodiment 1

A preparation method of a gallium oxide device based on high-temperature annealing technology is a method for regulating net carrier concentration in a selective region on a gallium oxide material, which includes following process steps 1 to 5.

In step 1, a first barrier layer is prepared on a surface of a gallium oxide wafer, the first barrier layer functions in blocking a high-temperature oxygen atmosphere during a high-temperature oxygen annealing process.

In step 2, a patterning process for regulating impurities of the gallium oxide wafer is implemented on the first barrier layer, a process depth of the patterning process does not exceed a thickness of the first barrier layer.

In step 3, the gallium oxide wafer subjected to above treatment is annealed in an oxygen atmosphere.

In step 4, the first barrier layer of the annealed gallium oxide wafer is removed.

In step 5, a surface layer of the gallium oxide wafer with the first barrier layer lifted off is removed.

In step 1, in an actual operation process, because the annealing atmosphere has a 360-degree all-around influence on the material, the first barrier layer needs to be covered on a whole surface of the gallium oxide wafer. In addition to a process of multiple growths, it is preferable to adopt a growth mode such as a LPCVD process, which covers the whole entire of the gallium oxide wafer through a single growth, which facilitates cost reduction. A material of the first barrier layer includes all of high-temperature resistant materials (with a reference temperature not less than 900° C.) which are simple substances or compounds that react with oxygen to form new compounds, with a thermal expansion coefficient not higher than $1\times10^{-4}$/K.

In step 2, specifically, the barrier layer can be patterned by photolithography or etching. A corresponding regional range for the region to be regulated is designed, and a patterning process for regulating impurities of the gallium oxide wafer is implemented for the designed region on the first barrier layer on the surface of the gallium oxide wafer by photolithography or etching. In adjusting a thickness of the first barrier layer and regulating the net carrier concentration, it is necessary to ensure that a process depth of the patterning process does not exceed a thickness of the first barrier layer.

In step 3, the gallium oxide wafer subjected to above treatment is annealed in an oxygen atmosphere. A material of the first barrier layer is a high-temperature resistant material, with a melting point not lower than an annealing temperature. In this embodiment, a material with a melting point not lower than the annealing temperature is adopted. Selection of the melting point of the high-temperature resistant material is adjusted adaptively according to actual requirements in an annealing process. On a basis of this scheme, regulation of the net carrier concentration in a gallium oxide selective region can be realized by a patterning process and annealing treatment.

Specifically, a prepared gallium oxide wafer sample is placed in a high-temperature apparatus for annealing in the oxygen atmosphere. The reference temperature can be from 600 to 1700° C. Theoretically, even a very short annealing time may affect the net carrier concentration of the sample, and degree of influence varies over time and with the temperature. In the annealing process, oxygen is continuously introduced, and oxygen content in the chamber should not be lower than that in air (21%).

Alternatively, other additional methods involve regulating the net carrier concentration by adjusting the oxygen atmosphere to, for example, 1) the concentration of general annealing treatment is not lower than the oxygen content in the air, but the net carrier concentration can also be regulated by controlling the oxygen concentration.

As another example, 2) a pressure in the chamber of the high-temperature apparatus in the above annealing treatment usually is one standard atmospheric pressure, but the net carrier concentration can also be regulated by adjusting atmospheric pressure parameters. 3) On the other hand, it should be noted that in annealing, the annealing time includes temperature rising and dropping time, and regulation of the net carrier concentration can be effectively realized by selecting an appropriate oxygen-supply stop point in a range from 400° C. (reference temperature) to the actual annealing temperature in temperature dropping. 4) Other methods of intermittently stopping oxygen supply in the annealing and introducing of other gases for auxiliary adjustment can also be considered, to name but some of the possibilities.

In step 4, the annealed sample is placed into a solution capable of corroding the first barrier layer for ultrasonic treatment so as to remove the first barrier layer. Because the first barrier layer may have an oxidized part after annealing in the oxygen atmosphere, the first barrier layer subjected to step 3 is a simple substance or compound that reacts with oxygen to form a new compound. Therefore, it is preferable to select a relevant solution that can dissolve raw materials and oxidized substances.

In step 5, according to application scenarios, removing and repairing is performed on a front surface and a back surface of the gallium oxide material with the first barrier layer removed successively. An etching depth of a surface with an epitaxial material or a surface subjected to patterning of the barrier layer is 0 to 1 lam, and an etching depth of a surface without the epitaxial material is 0 to 10 lam. A range of a surface removal thickness can be adjusted according to different application scenarios. In addition to etching, the surface layer can be removed by chemical mechanical polishing and other ways to uniformly thin the material, with a thickness similar to that of etching. Finally, a surface of the treated material is repaired by wet etching technology, with a reaction rate of a repair solution with the gallium oxide material is not higher than 100 nm/min.

In this embodiment, a thickness of the first barrier layer is not more than 100 microns, so as to prevent the barrier layer from falling off due to large vertical deformation caused by thermal expansion in a subsequent high-temperature annealing process. A requirement for the thickness of the first barrier layer is a test requirement of a current gallium oxide sample, and other parameters are not excluded.

Embodiment 2

The material of the first barrier layer selected in Embodiment 1 generally needs to meet requirements that it can be removed with a certain solution, and a reaction rate of this solution and the gallium oxide material does not exceed 10 nm/min. When there's difficulty in lifting off the first barrier layer, for example, it is difficult to lift off the first barrier layer with a solution due to impurities being generated in the annealing process, the impurities remain, or there may be a case that a solution used may react with the gallium oxide material in lifting off the first barrier layer or cost of this solution is too high, a new embodiment is provided to effectively remove the first barrier layer by increasing the liftoff layer in a case of ensuring surface quality of gallium oxide material.

Based on above reasons, a preparation method of a gallium oxide device is disclosed in this embodiment, which, referring to FIG. 1, includes following process steps 1' to 5'.

In step 1', as shown in FIG. 1-*a*, a first barrier layer 10 and a second barrier layer 20 are prepared on a surface of gallium oxide wafer, and the first barrier layer 10 functions in blocking a high-temperature oxygen atmosphere during a high-temperature oxygen annealing process. The second barrier layer 20 is a liftoff layer, which functions in peeling off the first barrier layer 10 after annealing. The gallium oxide wafer includes a gallium oxide substrate layer 40 and a gallium oxide epitaxial layer 30.

In step 2', as shown in FIG. 1-*b*, a patterning process for regulating impurities of the gallium oxide is implemented on the first barrier layer 10 and the second barrier layer 20, and a process depth of the patterning process does not exceed a thickness of the first barrier layer 10 plus a second barrier layer 20. Specifically, a depth of the second barrier layer 20 cannot be exceeded, that is, the process depth is greater than or equal to the thickness of the first barrier layer 10 and less than a total thickness of the first barrier layer 10 and the second barrier layer 20.

Alternatively, the first barrier layer in a patterned region 10-1 may not be completely removed for adjusting net carrier concentration in this region.

In step 3', as shown in FIG. 1-*c*, the gallium oxide subjected to above treatment is annealed in the oxygen atmosphere to form an annealed net carrier concentration regulation layer 30-1. As shown in FIG. 1-*c*, after the patterning process, a part of the first barrier layer is etched; and after annealing, a gallium oxide epitaxial layer with the first barrier layer remained and a gallium oxide epitaxial layer with the first barrier layer removed are with different influence depths, and the gallium oxide epitaxial layer with the first barrier layer remained is with a smaller influence depth.

In step 4', as shown in FIG. 1-*d*, the first barrier layer 10 and the second barrier layer 20 of gallium oxide subjected to the annealing are lifted off; and then, a surface layer of the gallium oxide wafer with the first barrier layer 10 and the second barrier layer 20 lifted off is removed.

A material of the first barrier layer 10 is a high-temperature resistant material, with a melting point not lower than an annealing temperature. In this embodiment, a material with a melting point not lower than the annealing temperature is adopted. Selection of the melting point of the high-temperature resistant material is adjusted adaptively according to actual requirements in an annealing process. A melting point of a material of the second barrier layer 20 is higher than the annealing temperature, and it is easy to be removed by hydrofluoric acid, concentrated sulfuric acid, hydrochloric acid, nitric acid and other solutions that have little influence on the surface quality of the gallium oxide material. In addition, the material of the second barrier layer 20 (liftoff layer) also has a low thermal expansion coefficient so as to avoid falling off during the annealing. Here, having less influence on the surface of the gallium oxide material indicates a corrosion rate less than 10 nm/min, and having a lower thermal expansion coefficient indicates the lower thermal expansion coefficient is no more than $1\times10^{-4}$/K. Parameters in this scheme are only for implementation reference and are not for specifically limiting.

To further optimize this embodiment, in order to prevent the barrier layer from falling off due to the large vertical deformation caused by thermal expansion during the high temperature annealing, the total thickness of the first barrier layer 10 and the second barrier layer 20 is not more than 100 microns, preferably not more than 10 microns.

In step 5, as shown in FIG. 1-*e*, according to application scenarios, removing and repairing is performed on a front surface and a back surface of the gallium oxide material with the first barrier layer 10 removed successively. An etching depth of a surface with an epitaxial material or a surface subjected to patterning of the barrier layer is 0 to 1 μm, and an etching depth of a surface without the epitaxial material is 0 to 10 μm. A part of a gallium oxide epitaxial region with the barrier layer remained that is affected by the annealing is removed before the annealing in a previous step.

Based on above steps, a gallium oxide wafer with net carrier concentration being regionally regulated can be obtained.

Embodiment 3

A preparation method of a gallium oxide device based on high-temperature annealing technology is provided in this embodiment. Regarding the barrier layer, it is different from Embodiment 1 and Embodiment 2. A first barrier layer and a second barrier layer are prepared on the surface of the gallium oxide wafer, the second barrier layer is located between the surface of gallium oxide wafer and the first barrier layer, and a patterning rate of the second barrier layer is lower than that of the first barrier layer, and materials of the first barrier layer and the second barrier layer are selected according to a temperature of the high-temperature oxygen annealing.

Based on Embodiment 1, a second barrier layer is added as an etching stop layer in this disclosure.

Based on Embodiment 2, a second barrier layer is added in this embodiment. When selecting the material of the second barrier layer, both a function of the liftoff layer and a function of the etching stop layer must be addressed at the same time.

Thus, a preparation method of a gallium oxide device is disclosed in this embodiment, which specifically include a method for regulating the net carrier concentration, and includes following process steps 1" and 2".

In step 1", a first barrier layer and a second barrier layer are prepared on a surface of a gallium oxide wafer. The first barrier layer functions in blocking a high-temperature oxygen atmosphere during the high-temperature oxygen annealing process. The second barrier layer is the liftoff layer and the etching stop layer. A technical solution for the second barrier layer being the liftoff layer can be referred to Embodiment 2, and in this embodiment, a technical scheme for the second barrier layer being the etching stop layer is mainly disclosed.

In step 2", a patterning process for regulating impurities of the gallium oxide is implemented on the first barrier layer and the second barrier layer, and a process depth of the patterning process does not exceed a thickness of the first barrier layer plus a second barrier layer. Specifically, a depth of the second barrier layer cannot be exceeded, that is, the process depth is greater than or equal to the thickness of the first barrier layer and less than a total thickness of the first barrier layer and the second barrier layer.

A dry etching process as the patterning process is specifically described as that the first barrier layer is on a surface of the second barrier layer, and the first barrier layer is etched by the dry etching process. When the dry etching process is used to etch the second barrier layer, a etching rate thereof may be reduced due to different materials. Therefore, the etching process can be provided with large etching temporal redundancy so as to ensure that this etching step may not affect the surface of the gallium oxide material.

According to the above, it can be known that technology regarding the etching stop layer disclosed in Embodiment 3 can be combined with Embodiment 1 and Embodiment 2 respectively to form two technical schemes.

Embodiment 4

Material examples of the first barrier layer and the second barrier layer are provided in this disclosure. Taking $SiO_2$ as the second barrier layer and Si layer as the first barrier layer as an example, it is found in selecting materials that Si has excellent high-temperature resistance, which can function in blocking the oxygen atmosphere during the high-temperature annealing, and $SiO_2$ is a substance that can be easily removed by hydrofluoric acid, concentrated sulfuric acid, hydrochloric acid, nitric acid and other solutions that have little influence on the surface quality of the gallium oxide material. It can function in lifting off the Si layer after oxidation, and at the same time, it has a low expansion coefficient so as to avoid falling off during the annealing. The Si layer is grown on a $SiO_2$ thin film and is etched by dry etching. However, when a Si etching process is used, an etching rate of a $SiO_2$ layer is slower than that of the Si layer, thus achieving the large etching temporal redundancy to ensure that this etching step may not affect the surface of the gallium oxide material.

With regard to the etching stop layer, it should be noted that when the barrier layer is removed by a dry etching process, a thickness of the $SiO_2$ layer is not less than 5 nm.

Figure 2:
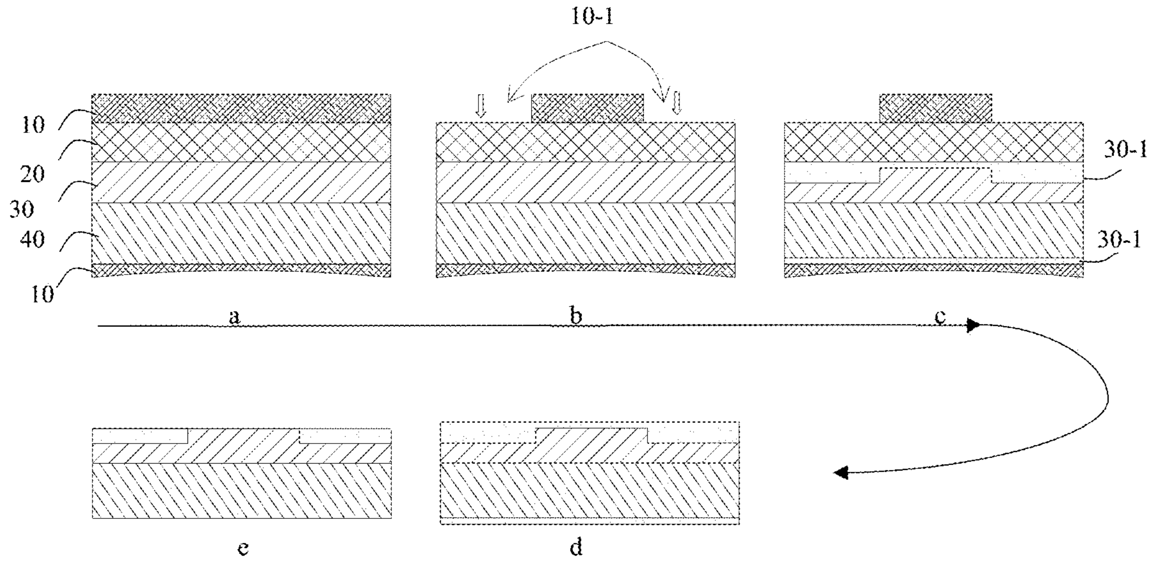
FIG. 2 is a flowchart of another method for regulating net carrier concentration disclosed in Embodiment 4.

A preparation method of a gallium oxide device based on high-temperature annealing technology, as shown in FIG. 2, includes following steps 100 to 500.

In step 100, as shown in FIG. 2-*a*,

The first barrier layer 10 is preferably made of Si, and the second barrier layer 20 is preferably made of $SiO_2$. The $SiO_2$ layer and the Si layer are grown on the surface of gallium oxide wafer by a PECVD process and a LPCVD process respectively and successively. The Si layer functions in blocking the oxygen atmosphere, and $SiO_2$ layer functions in lifting off the Si layer. A total thickness of the $SiO_2$ layer and the Si layer is not more than 100 microns, preferably not more than 10 microns, so as to prevent the barrier layer from falling off due to the large vertical deformation caused by thermal expansion in a subsequent high-temperature annealing process.

Considering that the Si layer is required to cover all of surfaces of the gallium oxide wafer, it is preferable to choose a growth mode such as a LPCVD process, which can cover the entire surface of a gallium oxide wafer sample through a single growth.

In step 200, as shown in FIG. 2-*b*,

The Si layer and the $SiO_2$ layer are patterned by photolithography or etching technology, with a depth of the patterning process being greater than a thickness of the Si layer and less than a total thickness of the two layers, that is, for a preset patterned region 10-1, the Si layer in the patterned region is removed and a part or all of the $SiO_2$ is retained.

The Si layer in the patterned region may not be completely removed for adjusting net carrier concentration in this region.

The $SiO_2$ layer can also be used as a layer to adjust net carrier concentration of a material, and net carrier concentration of the material in a region without the Si barrier layer can be regulated in a certain range by adjusting the thickness of the $SiO_2$ layer.

The etching technology includes dry etching and wet etching, that is, etching plasma or etching solution is used to perform a patterning process operation on the gallium oxide wafer, in which graphic accuracy of the dry etching is higher than that of the wet etching, and the dry etching can be preferred for a purpose of ensuring graphic accuracy.

In step 300, as shown in FIG. 2-*c*,

The gallium oxide wafer sample prepared according to a method in the step 100 to step 200 is placed in a high-temperature apparatus (such as an annealing furnace) for annealing in the oxygen atmosphere at a temperature of 600 to 1700° C. In the annealing process, oxygen is continuously introduced, and oxygen content in the chamber should not be lower than that in air (21%). In addition to above parameters, a pressure in a chamber of the high-temperature apparatus is one standard atmospheric pressure, and annealing time includes temperature rising and dropping time, and regulation of the net carrier concentration can be effectively realized by selecting an appropriate oxygen-supply stop point in a range from 400° C. to the actual annealing temperature in temperature dropping. A low net carrier concentration region 30-1 which is regionally regulated occurs.

Further, in actual operations, following ways can be adopted to realize the regulation of the net carrier concentration:

Controlling of net carrier concentration is realized by intermittently stopping oxygen supply in the annealing and introducing of other gases for auxiliary adjustment.

By changing oxygen concentration, net carrier concentration of the gallium oxide wafer sample can be controlled.

The net carrier concentration of the gallium oxide wafer sample can be regulated by adjusting air pressure parameters.

Generally, even a very short annealing time may affect the net carrier concentration of the gallium oxide wafer sample, but degree of influence varies over time and with the temperature. Therefore, the regulation of the net carrier concentration of the gallium oxide wafer sample can be further realized by adjusting a relationship between the time and the temperature.

In step 400, as shown in FIG. 2-*d*,

The gallium oxide wafer sample subjected to the annealing is placed into a solution capable of corroding $SiO_2$ for ultrasonic treatment so as to remove the barrier layer. The second barrier layer is a liftoff layer. Because an alkaline solution used to remove a Si material may react with the gallium oxide, the surface quality of the gallium oxide material may be damaged. Therefore, it is necessary to choose a non-alkaline solution, but the non-alkaline solution is not ideal for removing a $Si/SiO_2$ mixed layer subjected to the annealing. Therefore, as a preference of Embodiment 1, a second barrier layer is added in this scheme to function as the liftoff layer. It is ensured that the second barrier layer can be reacted and dissolved quickly in the non-alkaline solution, solving problems that the first barrier layer is not easy to be lifted off or a liftoff solution is easy to damage the gallium oxide material.

In step 500, as shown in FIG. 2-*e*,

According to application scenarios, removing and repairing is performed on a front surface and a back surface of the gallium oxide material with the $Si/SiO_2$ barrier layer removed successively. An etching depth of a surface with an epitaxial material or a surface subjected to patterning of the barrier layer is 0 to 1 μm, and an etching depth of a surface without the epitaxial material is 0 to 10 μm.

In addition to etching, the surface layer can be removed by chemical mechanical polishing and other ways to uniformly thin the material, with a thickness similar to that of etching. Finally, a surface of the treated material is repaired by wet etching technology, with a reaction rate of a repair solution with the gallium oxide material should be not higher than 100 nm/min.

Embodiment 5

Based on an example of the $Si/SiO_2$ barrier layer in Embodiment 4, referring to FIG. 2, specific implementation steps are as follows.

A wafer used in this case is single-crystal (001)-oriented β-phase gallium oxide, in which the wafer includes a (001)-oriented gallium oxide substrate with a high doping concentration ($\sim 10^{18}$ $cm^{-3}$) and a 9 μm single-crystal β-phase gallium oxide epitaxial film with a low doping concentration ($\sim 10^{16}$ $cm^{-3}$) grown on it by Halide vapor phase epitaxy (HVPE).

In FIG. 2-*a*, a $SiO_2$ layer with a thickness of 150 nm is grown on a gallium oxide thin film by PECVD, where the $SiO_2$ layer acts as the etching stop layer, the liftoff layer and the net carrier concentration regulation layer. Then a 400 nm polycrystalline Si layer continue to be grown by LPCVD as an oxygen atmosphere barrier. Due to growth characteristics of the LPCVD, the polycrystalline Si layer may cover an entire surface of the gallium oxide wafer material.

In FIG. 2-*b*, the barrier layer at a surface with epitaxial gallium oxide is patterned by photolithography and reactive ion etching (RIE). The so-called patterning is to select a region where the net carrier concentration needs to be changed and remove the Si barrier layer on this region. A part of $SiO_2$ can be removed, as margin of error or as a regulation requirement of impurity concentration.

In FIG. 2-*c*, the patterned gallium oxide wafer is placed in an annealing furnace for annealing. An oxygen flow is 3000 sccm, a pressure in the chamber is one standard atmospheric pressure, a temperature of the chamber is controlled at 1100° C., the temperature rising time is 2 hours, and the temperature dropping time to 500° C. is 2.5 hours. During the annealing, oxygen is continuously introduced, and is stopped when the temperature drops to 500° C.

In FIG. 2-*d*, the annealed gallium oxide wafer is placed in HF acid for ultrasonic cleaning for 20 min, so as to remove $SiO_2/Si$ barrier material; and is cleaned with acetone, isopropanol and deionized water in turn.

In FIG. 2-*e*, a back surface and a front surface (with the epitaxial layer) of the wafer are etched in turn by an inductively coupled plasma etcher. The front surface is etched by 600 nm and the back surface is etched by 1 μm. Chemical mechanical polishing (CMP) can be used instead. After the etching is completed, the wafer is immersed in a piranha solution ($H_2SO_4$:$H_2O_2$=3:1) for 15 min to repair etching defects. The etching process needs to be selectively implemented according to actual application scenarios, and is not limited. Description of this scheme is only for reference.

Embodiment 6

Figure 3:
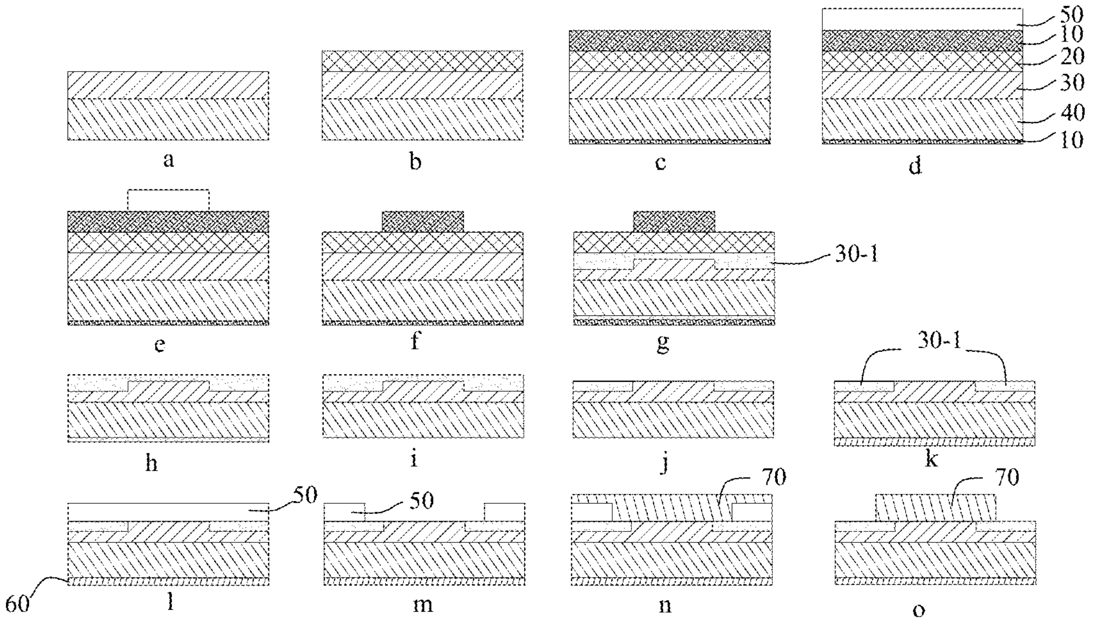
FIG. 3 is a flowchart of a preparation method of an anode edge terminal disclosed in Embodiment 6.

Based on Embodiment 1 to Embodiment 5 described above, a core idea of this scheme and implementation under this core idea can be clearly known. A preparation method of a gallium oxide device is further listed in this disclosure, in particular, a preparation method of an anode edge terminal. Referring to FIG. 3, photoresist is used as an etching covering layer of a patterning process, and specific steps are as follows.

In step 3-*a*, a gallium oxide wafer is prepared, which includes a gallium oxide substrate 40 and a gallium oxide epitaxial layer 30.

In step 3-*b*, a $SiO_2$ layer 20 is grown on a surface of the gallium oxide epitaxial layer for lifting off a Si layer and/or acting as an etching stop layer.

In step 3-*c*, a Si layer 10 (polysilicon layer) is grown on a surface of the $SiO_2$ layer and all of surfaces of the gallium oxide wafer for blocking the high-temperature oxygen atmosphere, specifically using an LPCVD process.

In step 3-*d*, photoresist 50 is spin-coated on a surface of the Si layer at an end of the gallium oxide epitaxial layer for the patterning process.

In step 3-*e*, a region where the net carrier concentration needs to be changed is exposed and developed to pattern the photoresist.

In step 3-*f*, the barrier layer, namely the Si layer, of a patterned part is removed by an etching process, and the photoresist 50 is washed off.

In step 3-*g*, annealing is performed for 8 hours, with an annealing atmosphere: 1100° C., one standard atmospheric pressure, an oxygen flow of 3000 sccm, and a chamber space of an annealing apparatus of 0.04 $m^3$. At this time, an original Si layer becomes a $Si/SiO_2$ mixture layer due to annealing in the oxygen atmosphere, in which low net carrier concentration regions 30-1 in different regions appear in a gallium oxide epitaxial region.

In step 3-*h*, a BOE solution is adopted to remove the barrier layer in a wet method. The barrier layer refers to the $Si/SiO_2$ mixture layer after the annealing and the $SiO_2$ layer.

In step 3-*i*, a back surface of the gallium oxide wafer is etched by 1 μm by ICP etching. In step 3-*j*, the back surface of the gallium oxide wafer is etched by 600 nm by ICP etching, and then placed in a piranha solution for 10 to 20 min.

In step 3-*k*, an ohmic contact electrode Ti/Au 60 is grown on the back surface of the gallium oxide wafer, that is, the gallium oxide substrate layer, by adopting physical vapor deposition technology.

In step 3-*l*, photoresist is spin coated on a front surface of the gallium oxide wafer, that is, on a surface of the gallium oxide epitaxial layer.

In step 3-*m*, the photoresist is exposed and developed to pattern the photoresist, which is different from the patterning in step 3-*e*. The patterning in this step is used to grow electrodes, and a patterning region in this step is designed according to the low net carrier concentration region 30-1 formed in step 3-*g*.

In step 3-*n*, a Schottky electrode 70 is grown by physical vapor deposition technology.

In step 3-*o*, excess metal of the Schottky electrode is removed and the photoresist is cleaned.

Meanwhile, the gallium oxide wafer with an epitaxial film can be replaced by a gallium oxide substrate without the epitaxial film, or an amorphous, polycrystalline or single crystal gallium oxide material grown on other substrates (such as sapphire, Si, GaN, SiC, etc., or a substrate with an epitaxial layer, such as a GaN substrate with AlGaN), with other processes remaining unchanged. The physical vapor deposition technology described above for example can be electron beam evaporation technology.

Embodiment 7

Figure 4:
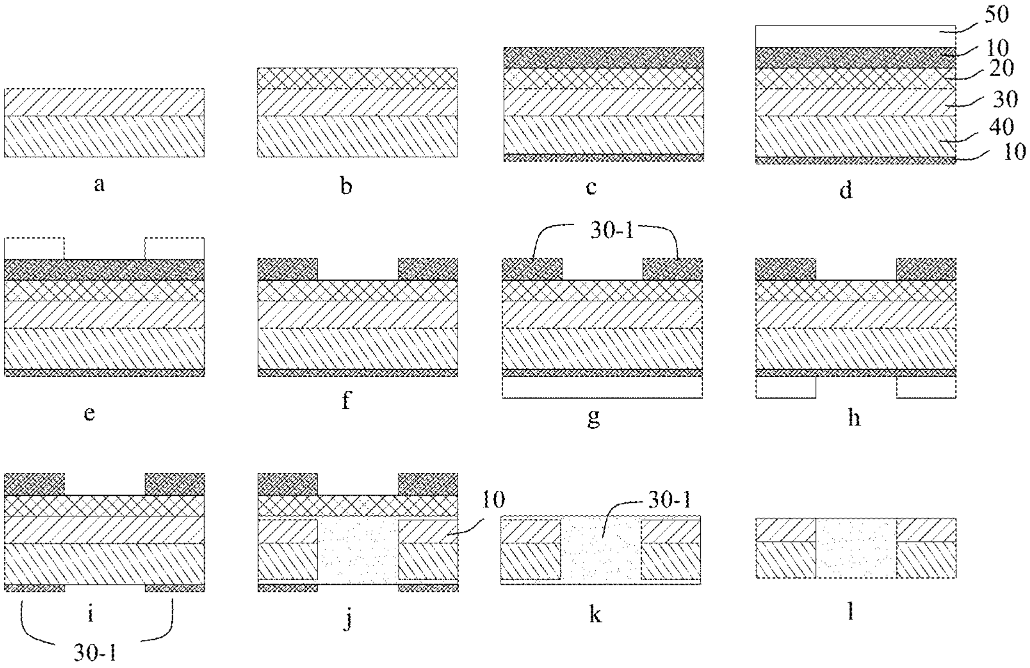
FIG. 4 is a flowchart of a preparation method of a device isolator disclosed in Embodiment 7.

Based on Embodiments 1 to 5 described above, a new preparation method of a gallium oxide device, specifically an isolation method between semiconductor devices, is further provided in this disclosure. Referring to FIG. 4, photoresist is used as an etching covering layer of a patterning process (other materials can also be used), and specific steps are as follows.

In step 4-*a*, a gallium oxide wafer is prepared, which includes a gallium oxide substrate 40 and a gallium oxide epitaxial layer 30.

In step 4-*b*, a $SiO_2$ layer 20 is grown on a surface of the gallium oxide epitaxial layer for lifting off a Si layer and/or acting as an etching stop layer.

In step 4-*c*, a Si layer 10 (polysilicon layer) is grown on a surface of the $SiO_2$ layer and all of surfaces of the gallium oxide wafer for blocking the high-temperature oxygen atmosphere, specifically using an LPCVD process.

In step 4-*d*, photoresist is spin-coated on a surface of the Si layer at an end of the gallium oxide epitaxial layer for the patterning process.

In step 4-*e*, a region on a front surface of the wafer where the net carrier concentration needs to be changed is exposed and developed to pattern the photoresist.

In step 4-*f*, the barrier layer, namely the Si layer, of a patterned part is removed by an etching process, specifically at a region on the wafer for device preparation, such as a middle part of the gallium oxide wafer shown in the figure, and the photoresist is washed off.

In step 4-*g*, photoresist is spin coated on a surface of the Si layer at an end of the gallium oxide substrate for the patterning process.

In step 4-*h*, similar to step 4-*e*, a region on a back surface of the wafer where the net carrier concentration needs to be changed is exposed and developed to pattern the photoresist, at a region on the wafer for device preparation.

In step 4-*i*, a barrier layer on the back surface, namely the Si layer, is removed by etching technology, and the photoresist is washed off. So far, the Si layer on the front surface and the back surface of the gallium oxide wafer is patterned, that is, a middle region acts as a selective regulation position.

In step 4-*g*, annealing is performed for 8 hours, with an annealing atmosphere: 1150° C., one standard atmospheric pressure, an oxygen flow of 3000 sccm, and a chamber space of an annealing apparatus of 0.04 $m^3$. At this time, an original Si layer becomes a $Si/SiO_2$ mixture layer due to annealing in the oxygen atmosphere, in which low net carrier concentration regions 30-1 in different regions appear in a gallium oxide epitaxial region and a substrate region.

In step 4-*k*, a BOE solution is adopted to remove the barrier layer in a wet method. The barrier layer refers to the $Si/SiO_2$ mixture layer after the annealing and the $SiO_2$ layer.

In step 4-*i*, the back surface of the gallium oxide wafer is etched by 1 μm by ICP etching. The back surface of the gallium oxide wafer is etched by 600 nm by ICP etching, and then placed in a piranha solution for 10 to 20 min to repair etching damage on the wafer surface.

There's a regulation limit for one annealing. If it needs to obtain a large-scale regulation range of net carrier concentration, it is necessary to repeat operations on the finally obtained wafer in Embodiment 6 with an annealing region at a same position. Before a second annealing, a last step of removing the surface layer in Embodiment 6 is a necessary process.

Others, such as passivation of a local region of a semiconductor surface and regulation of conductivity, design of an internal current barrier layer of an MOSFET device with a vertical structure, etc., can be deduced according to above embodiments. It should be noted that annealing time of each application needs to be adjusted according to requirements, and there are differences. Others include changing a thickness of the $SiO_2$ layer, changing a thickness of a polycrystalline Si layer, changing an annealing temperature, oxygen concentration, a chamber pressure and other parameters to match a design method. For example, if it is necessary to obtain lower net carrier concentration and a deeper low net carrier concentration region, it can be regulated by one or more ways such as increasing the annealing time, increasing the oxygen concentration, increasing the pressure, and reducing the thickness of the $SiO_2$ layer. On the contrary, a regulation method with a reverse trend can be used.

Embodiment 8

Figure 5:
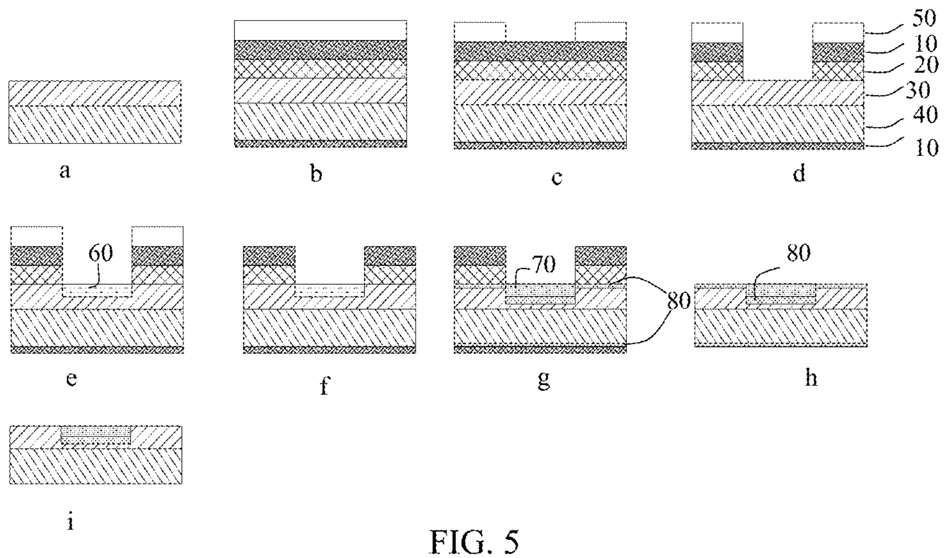
FIG. 5 is a flowchart of a method for regulating regional net carrier concentration based on ion implantation technology disclosed in Embodiment 8.

A process in which a barrier layer structure functions when impurities are activated at a high temperature in ion implantation technology is provided in this embodiment. A net carrier concentration regulation process based on the ion implantation technology is disclosed, as shown in FIG. 5.

In step 5-*a*, a gallium oxide wafer is prepared, which includes a gallium oxide substrate 40 and a gallium oxide epitaxial layer 30.

In step 5-*b*, following processes are performed: 1) growing a $SiO_2$ layer 20 on a surface of a gallium oxide epitaxial layer for lifting off a Si layer and/or acting as an etching stop layer; 2) growing a Si layer 10 (polysilicon layer) on a surface of the $SiO_2$ layer and all of surfaces of the gallium oxide wafer for blocking the high-temperature oxygen atmosphere, specifically using an LPCVD process; 3) spin coating photoresist 50 on a surface of the Si layer at an end of the gallium oxide epitaxial layer for the patterning process.

In step 5-*c*, a region where the net carrier concentration needs to be changed is exposed and developed to pattern the photoresist.

In step 5-*f*, the barrier layer, namely the Si layer and the $SiO_2$ layer 20, of a patterned part is removed by an etching process.

In step 5-*e*, required ions are implanted into the gallium oxide epitaxial layer 30 by ion implantation technology so as to form an ion implantation region 60, the implanted ions are acceptor impurities (Mg or N) or donor impurities.

In step 5-*f*, the photoresist is removed.

In step 5-*g*, annealing is performed for 8 hours, with an annealing atmosphere: 1100° C., one standard atmospheric pressure, an oxygen flow of 3000 sccm, and a chamber space of an annealing apparatus of 0.04 $m^3$. In a high temperature annealing environment, the ion implantation region 60 forms an implantation region 70 with impurities being activated, and the gallium oxide substrate 40 and the gallium oxide epitaxial layer 30 form a high resistance region 80 due to influence of oxygen annealing.

In step 5-*h*, the barrier layer is removed. The barrier layer refers to a $Si/SiO_2$ mixture layer after the annealing and the $SiO_2$ layer.

In step 5-*i*, an affected gallium oxide wafer surface layer is removed by ICP etching.

In this embodiment, after ion implantation of the gallium oxide material, impurity activation and lattice repair are usually performed by using annealing in a nitrogen or argon atmosphere. Annealing in the oxygen atmosphere itself may affect net carrier concentration of the material, so the oxygen atmosphere is not suitable as an annealing atmosphere for activation of implanted impurities before. The barrier structure for the oxygen atmosphere proposed in the disclosure can effectively isolate influence of oxygen on the net carrier concentration of the gallium oxide material, so that it is possible for the annealing in the oxygen atmosphere being used for activation of the implanted impurities. By implanting acceptor impurities or donor impurities into the local region of the gallium oxide wafer and covering the non-implanted area on the wafer with the barrier layer, it is promising that defects caused by high-energy particles can be repaired, and the net carrier concentration of the gallium oxide wafer can be regulated more accurately, giving full play to advantages of the two technologies.

In the above embodiments, description of respective embodiments has its own emphasis. For parts not detailed in one embodiment, reference can be made to related descriptions of other embodiments. Process steps discussed in the above embodiments of this disclosure are only some preferred implementations, which are used to illustrate feasibility of structures described in this disclosure and do not limit the scope of the disclosure. It is also within the protection scope of the present disclosure to realize concentration regulation methods of the present disclosure in other processes or sequences. The above is only specific embodiments of the present disclosure, but the protection scope of the present disclosure is not limited to this, and change or substitution within the technical scope disclosed by the present disclosure may occur to those of skill familiar with the art and should be encompassed within the protection scope of the present disclosure. Therefore, the protection scope of the present disclosure shall be subject to the protection scope of the claims.

The invention claimed is:

1. A preparation method of a gallium oxide device based on high-temperature annealing technology, comprising:

preparing a barrier layer on a surface of a gallium oxide wafer, the barrier layer functioning in blocking an oxygen atmosphere during a high-temperature oxygen annealing process;

implementing a patterning process for regulating impurities of the gallium oxide wafer on the barrier layer, wherein the preparing the barrier layer on the surface of the gallium oxide wafer comprises: preparing a first barrier layer and a second barrier layer on the surface of gallium oxide wafer, the first barrier layer being grown on a surface of the second barrier layer, the second barrier layer being located between the surface of gallium oxide wafer and the first barrier layer, the second barrier layer isolating the surface of gallium oxide wafer from the first barrier layer, the second barrier layer being a lift-off layer and an etching stop layer at the same time; a patterning rate of the second barrier layer being lower than that of the first barrier layer, and a process depth of the patterning process being greater than or equal to a thickness of the first barrier layer and the process depth being less than a total thickness of the first barrier layer and the second barrier layer;

annealing the gallium oxide wafer subjected to above treatment in the oxygen atmosphere, to form an annealed net carrier concentration regulation layer;

removing the first barrier layer and the second barrier layer of the annealed gallium oxide wafer;

removing a surface layer of the gallium oxide wafer after the first barrier layer and the second barrier layer have been lifted off; and patterning regions on a front surface and a back surface of a region on the gallium oxide wafer for device preparation.

2. The preparation method of the gallium oxide device based on high-temperature annealing technology according to claim 1, wherein the barrier layer is patterned by photolithography or etching.

3. The preparation method of the gallium oxide device based on high-temperature annealing technology according to claim 1, wherein a net carrier concentration is regulated by adjusting respective thicknesses or a total thickness of the first barrier layer and the second barrier layer; or a net carrier concentration of a patterned region not covered by the first barrier layer is regulated by adjusting the thickness of the second barrier layer.

4. The preparation method of the gallium oxide device based on high-temperature annealing technology according to claim 1, wherein the barrier layer is prepared on all surfaces of the gallium oxide wafer.

5. The preparation method of the gallium oxide device based on high-temperature annealing technology according to claim 1, wherein a net carrier concentration is regulated by parameters such as one or more of an annealing temperature, oxygen concentration and a chamber pressure of an annealing apparatus.

6. The preparation method of the gallium oxide device based on high-temperature annealing technology according to claim 1, wherein the barrier layer is patterned by dry etching, and an etching rate of the second barrier layer is less than that of the second barrier layer.

7. The preparation method of the gallium oxide device based on high-temperature annealing technology according to claim 1, wherein a material of the barrier layer is selected according to following requirements of:

a melting point being higher than the annealing temperature; and being capable of be removed by a solution with a slow reaction rate with the surface of gallium oxide material.

8. The preparation method of a gallium oxide device, wherein the preparation method adopts the preparation method of the gallium oxide device based on the high temperature annealing technology according to claim 1, and further comprises: after removing the surface layer of the gallium oxide wafer, growing an ohmic contact electrode on a back surface of the gallium oxide wafer, namely on a gallium oxide substrate layer;

spin coating photoresist on a front surface of the gallium oxide wafer, that is, on a surface of the gallium oxide epitaxial layer;

exposing and developing the photoresist so as to be patterned for growing electrodes, and designing a patterned region in this step in a region with low net carrier concentration;

growing a Schottky electrode by physical vapor deposition technology; and removing excess metal of the Schottky electrode and clean the photoresist.

9. The preparation method of a gallium oxide device, wherein the preparation method adopts the preparation method of the gallium oxide device based on the high temperature annealing technology according to claim 1, and comprises: after removing the barrier layer on a patterned part, implanting required ions into the gallium oxide epitaxial layer by ion implantation technology so as to form an ion implantation region, the implanted ions being acceptor impurities or donor impurities;

annealing the gallium oxide wafer subjected to above treatment in an oxygen atmosphere, in which in a high-temperature annealing environment, an implantation region with implanted impurities activated is formed at the ion implantation region, and a high-resistance region is formed at the gallium oxide substrate and the gallium oxide epitaxial layer form under influence of oxygen annealing;

removing the barrier layer of the annealed gallium oxide wafer; and removing a surface layer of the gallium oxide wafer after the barrier layer have been lifted off.

* * * * *